(12) United States Patent
Nadimpalli et al.

(10) Patent No.: US 8,410,966 B2
(45) Date of Patent: Apr. 2, 2013

(54) CURRENT DAC

(75) Inventors: Praveen Varma Nadimpalli, Chandler, AZ (US); Joseph Hubert Colles, Bonsall, CA (US)

(73) Assignee: RF Micro Devices, Inc., Greensboro, NC (US)

( * ) Notice: Subject to any disclaimer, the term of this patent is extended or adjusted under 35 U.S.C. 154(b) by 112 days.

(21) Appl. No.: 13/161,742

(22) Filed: Jun. 16, 2011

(65) Prior Publication Data

US 2012/0019405 A1 Jan. 26, 2012

Related U.S. Application Data

(60) Provisional application No. 61/367,244, filed on Jul. 23, 2010.

(51) Int. Cl.
*H03M 1/80* (2006.01)
(52) U.S. Cl. ........................ 341/153; 341/144
(58) Field of Classification Search .............. 341/153, 341/144, 135, 136
See application file for complete search history.

(56) References Cited

U.S. PATENT DOCUMENTS

| 5,001,484 | A | 3/1991 | Weiss |
| 6,507,304 | B1 | 1/2003 | Lorenz |
| 6,927,714 | B1 | 8/2005 | Teterwak |
| 7,764,210 | B2 * | 7/2010 | Rentala et al. ............... 341/144 |
| 7,928,784 | B2 * | 4/2011 | Li et al. ...................... 327/170 |
| 8,154,217 | B2 * | 4/2012 | Bergmann et al. ........... 315/291 |
| 2011/0090824 | A1 * | 4/2011 | Khatibi et al. ............... 370/278 |

* cited by examiner

*Primary Examiner* — Peguy Jean Pierre
(74) *Attorney, Agent, or Firm* — Withrow & Terranova, P.L.L.C.

(57) ABSTRACT

A current digital-to-analog converter (DAC) is disclosed. The current DAC includes a current reference circuit coupled between a voltage source terminal and a voltage node, wherein the current reference circuit includes a feedback node. A switchable resistor network is communicably coupled to the feedback node of the current reference circuit via a first feedback network that is adapted to equalize a first voltage across the switchable resistor network voltage with a second voltage between the feedback node and the voltage node. A current mirror includes an output node communicably coupled to the switchable resistor network via a second feedback network that is adapted to equalize an output current that flows from the output node with an input current that flows into the switchable resistor network.

20 Claims, 4 Drawing Sheets

CURRENT DAC

RELATED APPLICATIONS

This application claims the benefit of provisional patent application Ser. No. 61/367,244, filed Jul. 23, 2010, the disclosure of which is hereby incorporated herein by reference in its entirety.

FIELD OF THE DISCLOSURE

Embodiments of the present disclosure relate to current digital-to-analog converters (DACs).

BACKGROUND

In order to minimize process variation in wireless terminals, schemes for biasing power amplifiers (PAs) are migrating from voltage mode operation to current mode operation. Concurrently, advances in battery technology for wireless terminals are progressively reducing the minimum battery voltage needed to supply an operational current. In order to properly utilize the operational current for a wireless terminal supplied by a battery, a current steering digital-to-analog converter (DAC) is used to adjust the value of an output source current.

FIG. 1 is a circuit schematic depicting a related art current steering DAC 10. A first field effect transistor (FET) MP1 is coupled between a battery input VBAT and a current reference 12 that provides a reference current $I_{REF}$. The current reference 12 is a bandgap type reference that derives the reference current $I_{REF}$ from a bandgap voltage $V_{BG}$ and an external resistance $R_{EXT}$. The reference current $I_{REF}$ is mirrored through a second FET MP2 that has a drain through which an output current $I_{MP2}$ contributes to a DAC output current $I_{DAC}$. A plurality of current mirror branches 14 each have a current mirror FET that is in series with a logic switched FET that when switched on allows a mirror copy of the reference $I_{REF}$ to contribute to the DAC output current $I_{DAC}$. A FET MP3, a FET MP4, a FET MP5, and a FET MP6 make up the current mirror FETs for the current mirror branches 14. A FET MP7, a FET MP8, a FET MP9 and a FET MP10 make up the logic switched FETs of the current mirror branches 14.

A first current mirror branch made up of the FET MP3 and the FET MP7 selectively outputs a current $I_{MP3}$ based upon a logic state of a control input B1. A low logic state for the control input B1 turns on the FET MP7 and allows the output current $I_{MP3}$ to contribute to the DAC output current $I_{DAC}$. A high logic state for the control input B1 turns off the FET MP7 to shut off the output current $I_{MP3}$.

A second current mirror branch made up of the FET MP4 and the FET MP8 selectively outputs a current $I_{MP4}$ based upon a logic state of a control input B2. A low logic state for the control input B2 turns on the FET MP8 and allows the output current $I_{MP4}$ to contribute to the DAC output current $I_{DAC}$. A high logic state for the control input B2 turns off the FET MP8 to shut off the output current $I_{MP4}$.

A third current mirror branch made up of the FET MP5 and the FET MP9 selectively outputs a current $I_{MP5}$ based upon a logic state of a control input B3. A low logic state for the control input B3 turns on the FET MP9 and allows the output current $I_{MP5}$ to contribute to the DAC output current $I_{DAC}$. A high logic state for the control input B3 turns off the FET MP9 to shut off the output current $I_{MP5}$.

A fourth current mirror branch made up of the FET MP6 and the FET MP10 selectively outputs a current $I_{MP6}$ based upon a logic state of a control input B4. A low logic state for the control input B4 turns on the FET MP10 and allows the output current $I_{MP6}$ to contribute to the DAC output current $I_{DAC}$. A high logic state for the control input B4 turns off the FET MP10 to shut off the output current $I_{MP6}$.

There are at least two significant disadvantages attributable to the current steering DAC 10. One significant disadvantage is that each of the current mirror legs 14 needs to be cascoded to reduce variations in the DAC output current over a range of battery voltage $V_{BAT}$ for a given output voltage $V_{IDAC}$. However, if each of the current mirror legs 14 is cascoded, a die size for the current steering DAC 10 will significantly increase. Minimization of die size is highly desirable. Therefore, any significant increase in die size is problematic.

A second disadvantage is that for proper operation of the current steering DAC 10, a voltage drop across the FETs MP2 through MP6 should be at least equal to a maximum drain-to-source voltage $V_{DSAT}$. Thus, for proper operation, the current steering DAC 10 is governed by the following mathematical relationships:

$$V_{IDAC} > V_{BAT} - V_{DSAT} \text{ (non-cascoded current mirror branches)}$$

$$V_{IDAC} > V_{BAT} - 2V_{DSAT} \text{ (cascoded current mirror branches)}$$

The output voltage $V_{IDAC}$ can be increased by decreasing the maximum drain-to-source voltage $V_{DSAT}$, which can be accomplished by increasing the width of each of the FETs MP2 through MP6. However, in order to increase the maximum drain-to-source voltage $V_{DSAT}$ by a factor of two, the width of each of the FETs MP2 through MP6 must be increased by a factor of four. This is because the maximum drain-to-source voltage $V_{DSAT}$ is a square root function of width for a FET.

As a result of the above disadvantages, there is a need for a current DAC that does not require cascoded current mirror branches. Moreover, there is a need for a current DAC that has an increased maximum drain-to-source voltage $V_{DSAT}$ without needing an increase in width for each of the current mirror FETs making up the current DAC.

SUMMARY

The present disclosure provides a current digital-to-analog converter (DAC) that does not require cascoded current mirror branches. Additionally, the current DAC of the present disclosure provides an increased maximum drain-to-source voltage $V_{DSAT}$ without needing an increase in width for each of the current mirror FETs making up the current DAC.

In general, the disclosed current DAC includes a current reference circuit coupled between a voltage source and a voltage node, wherein the current reference circuit includes a feedback node. A switchable resistor network is communicably coupled to the feedback node of the current reference circuit via a first feedback network that is adapted to equalize a first voltage across the switchable resistor network with a second voltage between the feedback node and the voltage node. A current mirror includes an output node communicably coupled to the switchable resistor network via a second feedback network that is adapted to equalize an output current that flows from the output node with an input current that flows into the switchable resistor network.

In an embodiment, the switchable resistor network includes an unswitchable resistor branch in parallel with a plurality of switchable resistor branches. Current flow through switchable resistor branches is controlled by a control system that outputs logic signals that control the logic state of electronic switches that are in series with resistors making up the switchable resistor branches. Moreover, an embodiment of the plurality of switchable resistor branches has binary-weighted resistance values.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWINGS FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

Figure 1:
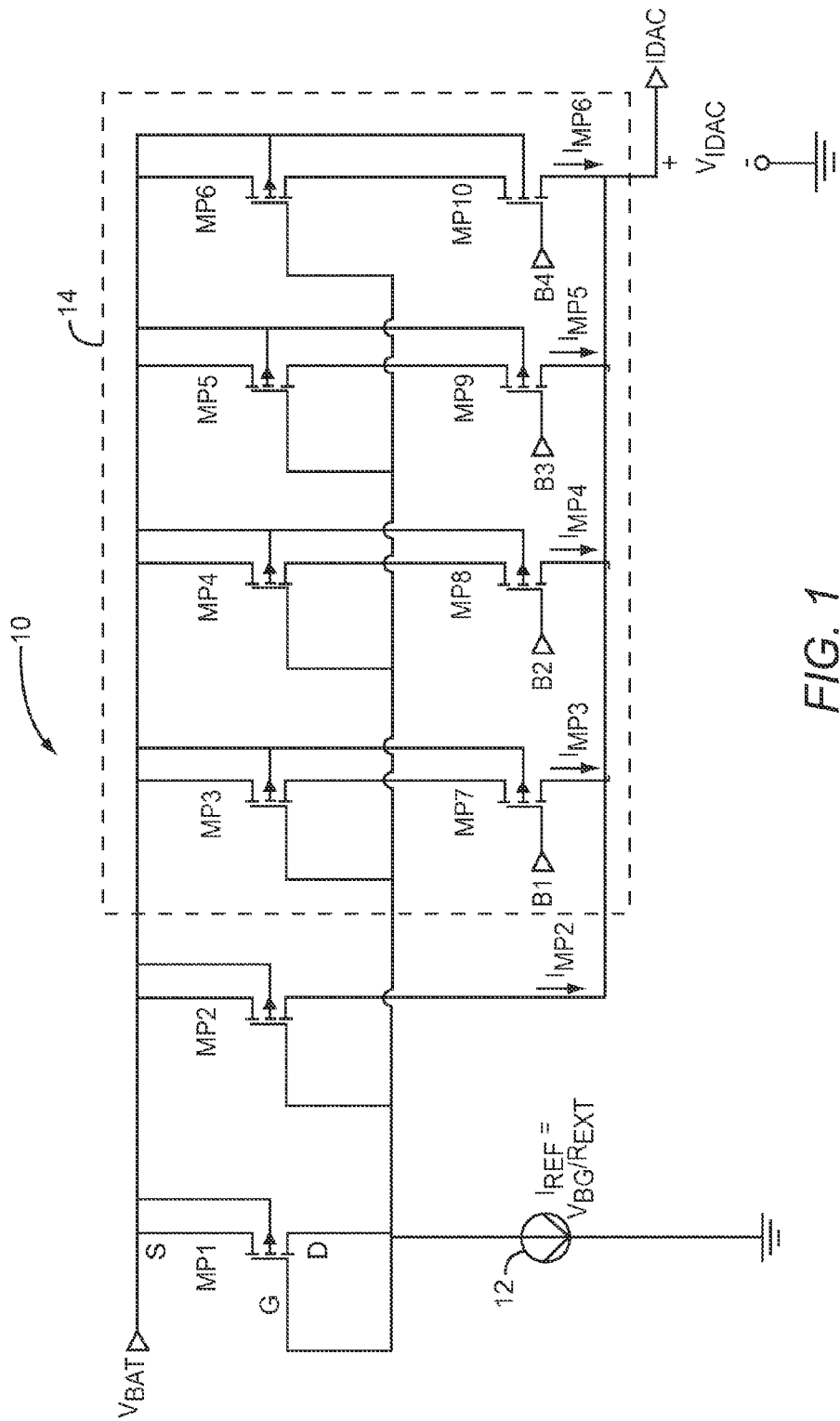
FIG. 1 is a circuit schematic depicting a related art current steering digital-to-analog converter (DAC).
Figure 2:
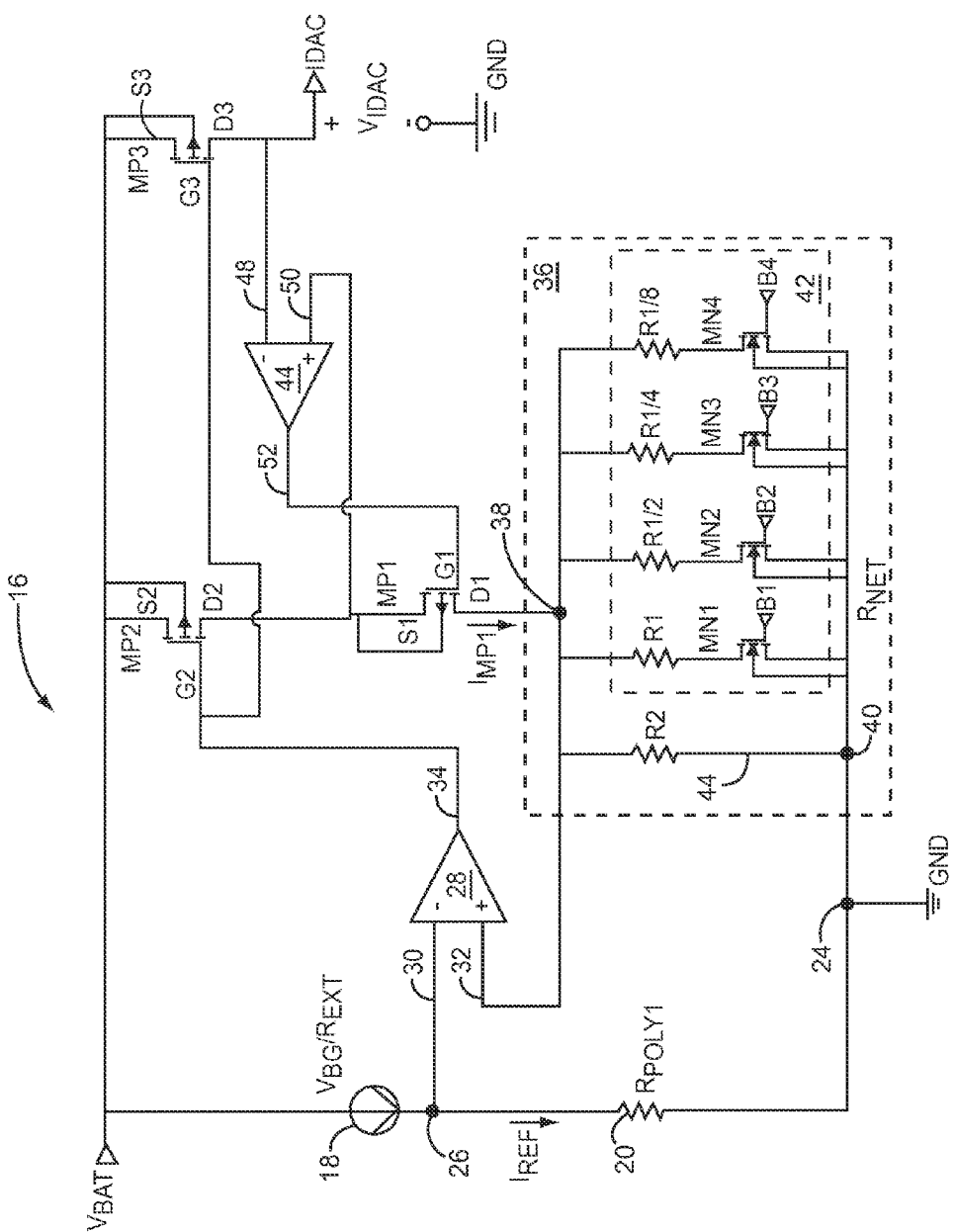
FIG. 2 is a circuit schematic depicting a current DAC that is in accordance with the present disclosure.

FIG. 2 is a circuit schematic depicting a current DAC 16 that is in accordance with the present disclosure. A current reference 18 has an input coupled to a voltage source terminal $V_{BAT}$, and an output through which a reference current $I_{REF}$ flows. The current reference 18 is a bandgap type reference that derives the reference current $I_{REF}$ from a bandgap voltage $V_{BG}$ and an external resistance $R_{EXT}$ (not shown).

A reference resistor 20 ($R_{POLY1}$) that is preferably fabricated from polysilicon includes a first terminal coupled to the output of the current reference 18 and a second terminal coupled to a voltage node 24, which can be ground (GND). A feedback node 26 includes the first terminal of the reference resistor 20 ($R_{POLY1}$) and the output of the current reference 18.

A first error amplifier 28 has an inverting input 30, a non-inverting input 32, and an error output 34. The inverting input 30 is coupled to the feedback node 26.

A switchable resistor network 36 ($R_{NET}$) includes a current input 38 that is coupled to the non-inverting input 32 of the first error amplifier 28 and a current output 40 coupled to the voltage node 24. The switch resistor network 36 is made up of a plurality of switchable resistor branches 42 that is in parallel with an unswitchable resistor branch 44 having a resistor R2. The plurality of switchable resistor branches 42 each includes a resistor in series with a transistor switch having a control input that is responsive to a control signal having a first state for turning the transistor switch on and a second state for turning the transistor off. For example, the first state can be a high logic state such as a voltage about equal to a battery voltage of a battery (not shown) that is attachable between the voltage source terminal $V_{BAT}$ and the voltage node 24. The second state can be a low logic state such as a voltage about equal to zero volts.

The exemplary embodiment of the switchable resistor network 36 has a first resistor branch that is made up of a first resistor R1 in series with a first transistor switch in the form of a FET MN1 having a first control input B1 coupled to the gate (G) of the FET MN1. A high logic state for the control input B1 turns on the FET MN1 and allows current to flow through the first resistor R1. A low logic state on the control input B1 turns off the FET MN1 to shut off current flow through the first resistor R1.

A second resistor branch is made up of a second resistor R1/2 in series with a second transistor switch in the form of a FET MN2 having a second control input B2 coupled to the gate (G) of the FET MN2. A high logic state for the control input B2 turns on the FET MN2 and allows current to flow through the first resistor R1/2. A low logic state for the control input B2 turns off the FET MN2 to shut off current flow through the second resistor R1/2. A value of resistance for the second resistor R1/2 is about one-half the value of the resistance of the first resistor R1.

A third resistor branch is made up of a third resistor R1/4 in series with a third transistor switch in the form of a FET MN3 having a third control input B3 coupled to the gate (G) of the FET MN3. A high logic state for the control input B3 turns on the FET MN3 and allows current to flow through the third resistor R1/4. A low logic state for the control input B3 turns off the FET MN3 to shut off current flow through the third resistor R1/4. A value of resistance for the third resistor R1/4 is about one-fourth the value of the resistance of the first resistor R1.

A fourth resistor branch is made up of a fourth resistor R1/8 in series with a fourth transistor switch in the form of a FET MN4 having a fourth control input B4 coupled to the gate (G) of the FET MN4. A high logic state for the control input B4 turns on the FET MN4 and allows current to flow through the third resistor R1/8. A low logic state for the control input B4 turns off the FET MN4 to shut off current flow through the third resistor R1/8. A value of resistance for the fourth resistor R1/8 is about one-eighth the value of the resistance of the first resistor R1.

A first FET MP1 has a drain (D1) coupled to the current input 38 of the switchable resistor network 36. A second FET MP2 has a drain (D2) coupled to a source (S1) of the first FET MP1 and a gate (G2) coupled to the error output 34 of the first error amplifier 28. A third FET MP3 has a drain (D3) that is an output for an output current $I_{DAC}$. The third FET MP3 has a gate (G3) coupled to the gate (G2) of the second FET MP2 in a current mirror configuration.

A second error amplifier 46 has an inverting input 48 coupled to the drain (D3) of the third FET MP3, a non-inverting input 50 is coupled to the drain (D2) of the second FET MP2, and an error output 52 is coupled to the gate (G1) of the first FET MP1.

A first feedback loop formed by the first error amplifier 28 sets a current $I_{MP1}$ that flows through the first FET MP1. A value for the current $I_{MP1}$ is given by the following equation.

$$I_{MP1} = \frac{V_{BG} * R_{POLY1}}{R_{EXT} * R_{NET}}$$

The switchable resistor network 36 ($R_{NET}$) and the reference resistor 20 ($R_{POLY1}$) are preferably polysilicon resistor types. In this way, resistance variations between the switchable resistor network 36 ($R_{NET}$) and the reference resistor 20 ($R_{POLY1}$) are cancelled out since the reference resistor 20 ($R_{POLY1}$) is divided by a total resistance of the switchable resistor network $R_{NET}$ in the above equation for the current $I_{MP1}$ that flows through the first FET MP1. Thus, any variation in the current $I_{MP1}$ will be primarily due to variations in the bandgap voltage $V_{BG}$, and external resistor $R_{EXT}$. As described above, the resistance of the switchable resistor network 36 ($R_{NET}$) is varied by controlling bit settings for the control inputs B1, B2, B3, and B4, which set the current $I_{MP1}$ and ultimately the output current $I_{DAC}$.

In operation, the current reference 18 generates the reference current $I_{REF}$ that flows through the reference resistor 20 ($R_{POLY1}$) to produce a first voltage that appears between the feedback node 26 and the voltage node 24. The first feedback loop made up by the error amplifier 28, and the FET MP2 equalizes the first voltage that is between the feedback node 26 and the voltage node 24 with a voltage generated across the switchable resistor network 36 as the current $I_{MP1}$ flows through the FET MP1 and into the current input 38 of the switchable resistor network 36. A second feedback loop made up of the second error amplifier 44 and the FET MP1 equalizes the drain (D3) voltage with the drain (D4) voltage. In this way, the drain current in the FET MP2 and the drain current in the FET MP3 are equalized even if the operation of the FET MP3 enters a linear region when $V_{IDAC}<V_{BAT}-V_{DSAT}$.

Figure 3:
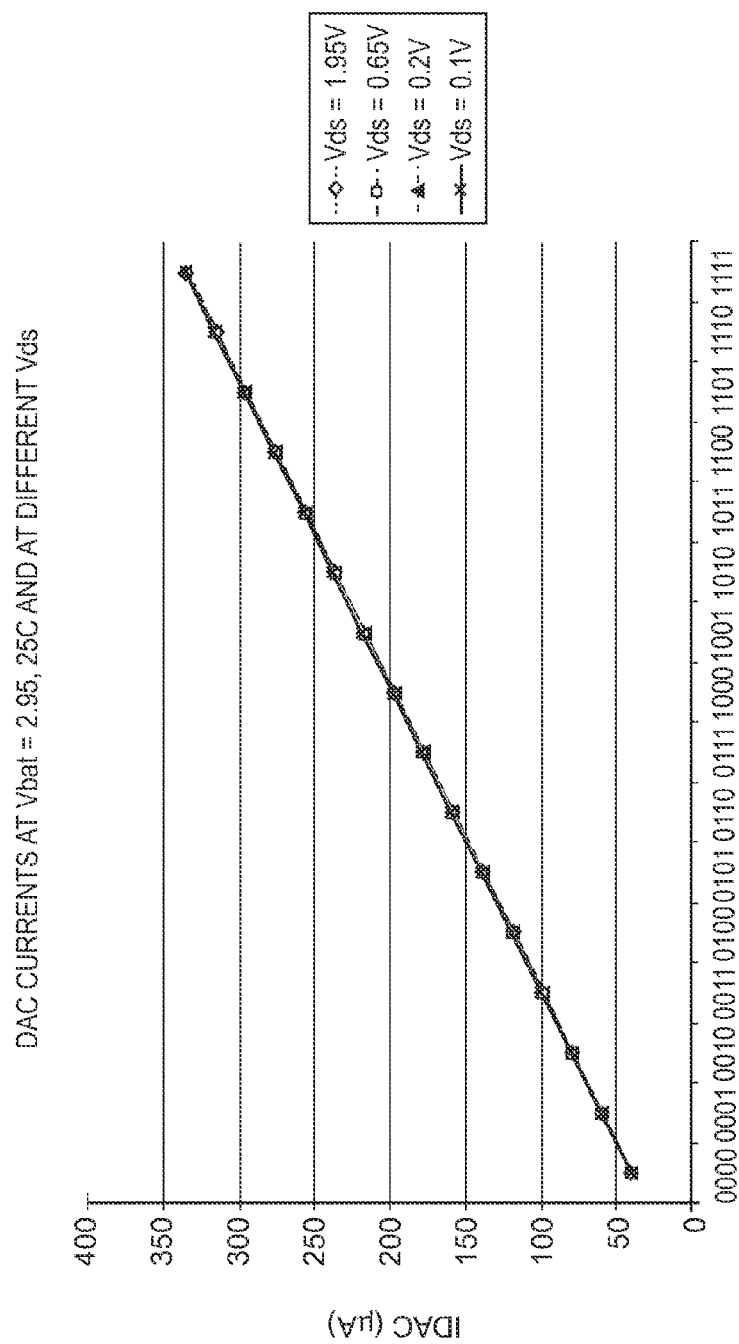
FIG. 3 is a graph of DAC output currents for a range of bit settings versus a range of drain-to-source voltage (Vds).

FIG. 3 is a graph of DAC output currents for a range of bit settings versus a range of the drain-to-source voltage Vds for the FET MP3. In this case, the drain-to-source voltage Vds for the FET MP3 (FIG. 2) is equal to the battery voltage $V_{BAT}$ minus the output voltage $V_{IDAC}$. Current measurements for the output current $I_{DAC}$ were made as the drain-to-source voltage Vds of the FET MP3 was stepped from about 0.1V to about 1.95V. The control inputs B1 through B4 were incremented through a full range of logic states (i.e., bit settings) for each step in the drain-to-source voltage Vds. A particular instance of the FET MP3 had a maximum drain-to-source voltage $V_{DSAT}$ of about 0.25V when the measurements for the output current $I_{DAC}$ were made. Interestingly, even when the drain-to-source voltage Vds was equal to 0.1V with the FET MP3 operating in the triode region, the variation of the output current was less than 0.4%. This shows that a current that flows through the FET MP2 tracks a current that flows through the FET MP3 as operation of the FET MP2 and the FET MP3 transitions from operating in a saturation region to operating in a linear region.

Figure 4:
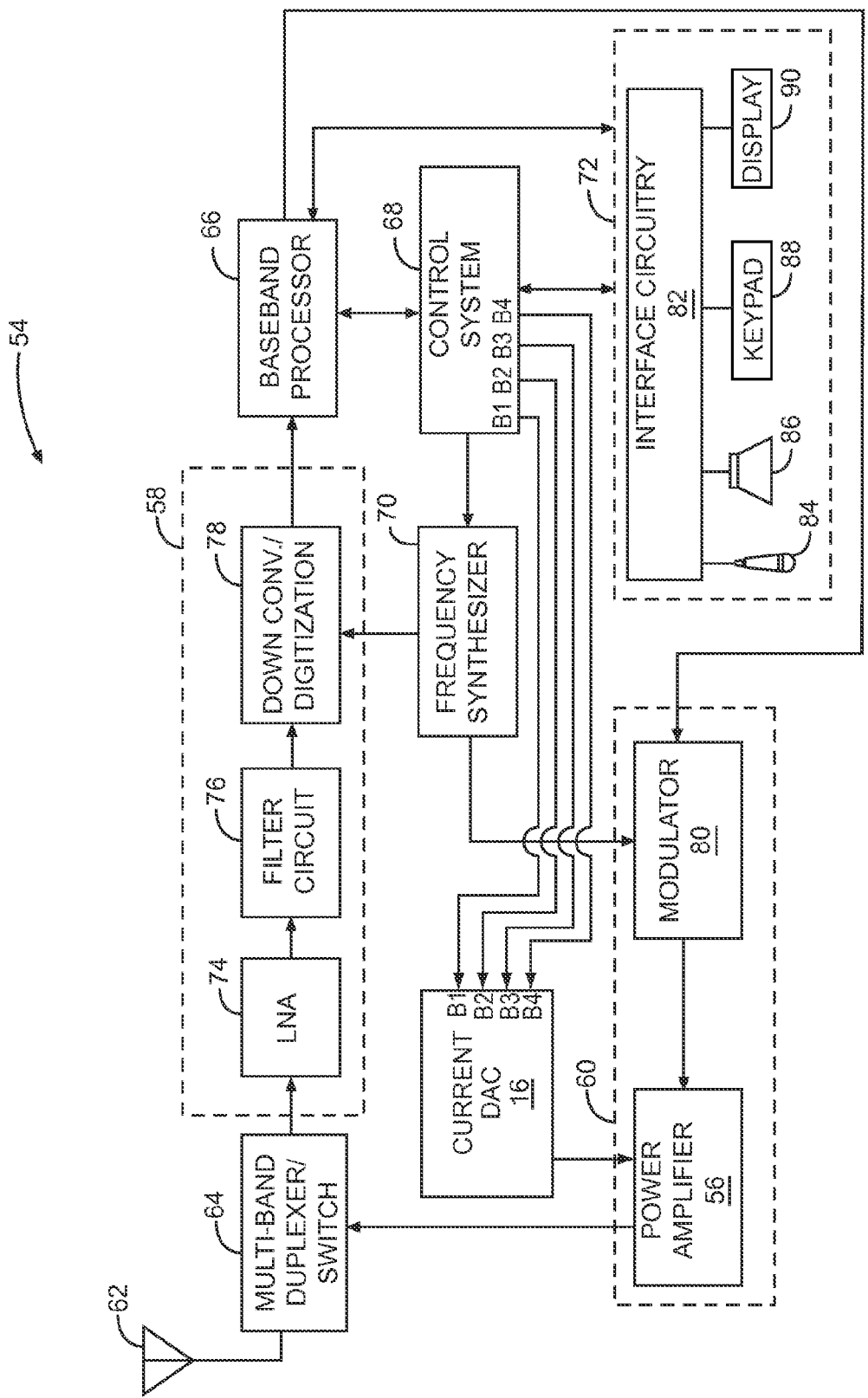
FIG. 4 is a block diagram depicting a mobile terminal that incorporates the current DAC of the present disclosure.

FIG. 4 depicts the basic architecture of user equipment (UE) in the form of a mobile terminal 54 that incorporates an embodiment of the current DAC 16 of FIG. 2. In particular, the current DAC 16 is usable to bias a power amplifier 56 in the mobile terminal 54. The mobile terminal 54 may include a receiver front end 58, a radio frequency (RF) transmitter section 60, an antenna 62, a multi-band duplexer/switch 64, a baseband processor 66, a control system 68, a frequency synthesizer 70, and an interface 72. The receiver front end 58 receives information bearing radio frequency signals from one or more remote transmitters provided by a base station (not shown). A low noise amplifier (LNA) 74 amplifies the signal. A filter circuit 76 minimizes broadband interference in the received signal, while down conversion and digitization circuitry 78 down converts the filtered, received signal to an intermediate or baseband frequency signal, which is then digitized into one or more digital streams. The receiver front end 58 typically uses one or more mixing frequencies generated by the frequency synthesizer 70. The baseband processor 66 processes the digitized received signal to extract the information or data bits conveyed in the received signal. This processing typically comprises demodulation, decoding, and error correction operations. As such, the baseband processor 66 is generally implemented in one or more digital signal processors (DSPs).

On the transmit side, the baseband processor 66 receives digitized data, which may represent voice, data, or control information, from the control system 68, which it encodes for transmission. The encoded data is output to the RF transmitter section 60, where it is used by a modulator 80 to modulate a carrier signal that is at a desired transmit frequency. The power amplifier 56 amplifies the modulated carrier signal to a level appropriate for transmission, and delivers the amplified and modulated carrier signal to the antenna 62 through the a power amplifier 56. The control system 68 controls logic levels for the bits B1, B2, B3, and B4 that select the level of output current IOUT from the current DAC 16 as needed.

A user may interact with the mobile terminal 54 via the interface 72, which may include interface circuitry 82 associated with a microphone 84, a speaker 86, a keypad 88, and a display 90. The interface circuitry 82 typically includes analog-to-digital converters, digital-to-analog converters, amplifiers, and the like. Additionally, it may include a voice encoder/decoder, in which case it may communicate directly with the baseband processor 66. The microphone 84 will typically convert audio input, such as the user's voice, into an electrical signal, which is then digitized and passed directly or indirectly to the baseband processor 66. Audio information encoded in the received signal is recovered by the baseband processor 66, and converted by the interface circuitry 82 into an analog signal suitable for driving the speaker 86. The keypad 88 and the display 90 enable the user to interact with the mobile terminal 54, input numbers to be dialed, address book information, or the like, as well as monitor call progress information.

Those skilled in the art will recognize improvements and modifications to the preferred embodiments of the present disclosure. All such improvements and modifications are considered within the scope of the concepts disclosed herein and the claims that follow.

What is claimed is:

1. A current digital-to-analog (DAC) comprising:
    a current reference circuit coupled between a voltage source terminal and a voltage node and comprising a feedback node;
    a switchable resistor network communicably coupled to the feedback node of the current reference circuit via a first feedback network that is adapted to equalize a first voltage between the feedback node and the voltage node with a second voltage across the switchable resistor network; and
    a current mirror comprising an output node communicably coupled to the switchable resistor network via a second feedback network that is adapted to equalize an output current that flows from the output node with an input current that flows into the switchable resistor network.

2. The current DAC of claim 1 wherein the voltage node is ground.

3. The current DAC of claim 1 wherein the switchable resistor network comprises an unswitchable resistor branch in parallel with a plurality of switchable resistor branches.

4. The current DAC of claim 3 wherein the plurality of switchable resistor branches each includes a resistor in series with a transistor switch having a control input that is responsive to a control signal having a state for turning the transistor switch on and a state for turning the transistor switch off.

5. The current DAC of claim 4 wherein the transistor switch of each of the plurality of switchable resistor branches is a field effect transistor (FET).

6. The current DAC of claim 4 wherein the transistor switch of each of the plurality of switchable resistor branches is a FET.

7. The current DAC of claim 3 wherein the plurality of switchable resistor branches have binary-weighted resistance values.

8. A method of supplying a controllable current, comprising:
   providing a current DAC having a current reference circuit having a feedback node, a switchable resistor network that is communicably coupled to the feedback node of the current reference circuit via a first feedback network, and a current mirror having an output node communicably coupled to the switchable resistor network via a second feedback network;
   equalizing a first voltage between the feedback node and a voltage node with a second voltage across the switchable resistor network; and
   equalizing an output current that flows from the output node with an input current that flows into the switchable resistor network.

9. The method of claim 8 wherein the voltage node is ground.

10. The method of claim 8 wherein the switchable resistor network comprises an unswitchable resistor branch in parallel with a plurality of switchable resistor branches.

11. The current DAC of claim 10 wherein the plurality of switchable resistor branches each includes a resistor in series with a transistor switch having a control input that is responsive to a control signal having a state for turning the transistor switch on and a state for turning the transistor switch off.

12. The method of claim 10 wherein the plurality of switchable resistor branches have binary-weighted resistance values.

13. A current digital-to-analog converter (DAC) comprising:
    a current reference having an input coupled to a voltage source terminal and an output;
    a reference resistor having a first terminal coupled to the output of the current reference and a second terminal coupled to a voltage node;
    a first error amplifier having an inverting input coupled to the first terminal of the reference resistor, a non-inverting input, and an error output;
    a switchable resistor network having a current input coupled to the non-inverting input of the first error amplifier and a current output coupled to the voltage node;
    a first FET having a drain coupled to the first terminal of the switchable resistor network, a source and a gate;
    a second FET having a drain coupled to the source of the first FET, a gate coupled to the error output of the first error amplifier, and a source;
    a third FET having a drain that is an output for an output current, a gate coupled to the gate of the second FET and a source; and
    a second error amplifier having an inverting input coupled to the drain of the third FET, a non-inverting input coupled to the drain of the second FET, and an error output coupled to the gate of the first FET.

14. The current DAC of claim 13 wherein the voltage node is ground.

15. The current DAC of claim 13 wherein the switchable resistor network comprises an unswitchable resistor branch in parallel with a plurality of switchable resistor branches.

16. The current DAC of claim 15 wherein the plurality of switchable resistor branches each includes a resistor in series with a transistor switch having a control input that is responsive to a control signal having a state for turning the transistor switch on and a state for turning the transistor switch off.

17. The current DAC of claim 16 wherein the transistor switch of each of the plurality of switchable resistor branches is a FET.

18. The current DAC of claim 15 wherein the plurality of switchable resistor branches have binary-weighted resistance values.

19. The current DAC of claim 15 wherein an area ratio between the second FET and the third FET sets a ratio between a current that flows though each of the plurality of switchable resistor branches and a reference current that is generated by the current reference.

20. The current DAC of claim 13 wherein a current that flows through the second FET tracks a current that flows through the third FET as operation of the second FET and the third FET transitions from operating in a saturation region to operating in a linear region.

* * * * *